(12) United States Patent
Lim

(10) Patent No.: US 8,828,775 B2
(45) Date of Patent: Sep. 9, 2014

(54) IMAGE SENSOR AND METHOD FOR FABRICATING SAME

(75) Inventor: Youn-Sub Lim, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 466 days.

(21) Appl. No.: 13/194,142

(22) Filed: Jul. 29, 2011

(65) Prior Publication Data

US 2012/0028394 A1 Feb. 2, 2012

Related U.S. Application Data

(62) Division of application No. 12/219,499, filed on Jul. 23, 2008, now Pat. No. 7,999,252.

(30) Foreign Application Priority Data

Jul. 24, 2007 (KR) .................. 10-2007-0074105

(51) Int. Cl.
*H01L 31/18* (2006.01)
(52) U.S. Cl.
USPC .................. 438/57; 438/48; 438/59
(58) Field of Classification Search
USPC .................. 438/48, 57, 59
See application file for complete search history.

(56) References Cited

U.S. PATENT DOCUMENTS 6,521,920 B2  2/2003  Abe

FOREIGN PATENT DOCUMENTS

| JP | 2000-031525 | 1/2000 |
| JP | 2001-185711 | 7/2001 |
| JP | 2005-317768 | 11/2005 |
| JP | 2006-191034 | 7/2006 |
| KR | 10-2002-0022931 | 3/2002 |
| KR | 10-2003-0000653 | 1/2003 |
| KR | 100677044 | 1/2003 |
| KR | 10-2006-0010886 | 2/2006 |
| TW | 200715541 | 4/2007 |
| TW | 200721522 | 6/2007 |

OTHER PUBLICATIONS

Machine translation of KR 10-2001-000027712.
Korean Intellectual Property Office, Notice of Preliminary Rejection, App. No. 10-2007-0074105, Sub Date: Sep. 15, 2008, dated by KIPO: Sep. 29, 2008, pp. 1-7.

*Primary Examiner* — Long Pham
(74) *Attorney, Agent, or Firm* — McAndrews, Held & Malloy, Ltd.

(57) ABSTRACT

An image sensor includes an epi-layer of a first conductivity type formed in a substrate, a photodiode formed in the epi-layer, and a first doping region of a second conductivity type formed under the photodiode to separate the first doping region from the photodiode.

24 Claims, 5 Drawing Sheets

IMAGE SENSOR AND METHOD FOR FABRICATING SAME

CROSS-REFERENCE TO RELATED APPLICATIONS

The present invention is a divisional application of U.S. patent application Ser. No. 12/219,499 filed on Jul. 23, 2008 now U.S. Pat. No. 7,999,252, and claims priority to Korean patent application number 10-2007-0074105, filed on Jul. 24, 2007, both of which are herein incorporated by reference in their entireties.

BACKGROUND OF THE INVENTION

The present invention relates to a semiconductor fabrication technology, and in particular, to an image sensor and a method for fabricating the same, and more particularly, to a complementary metal-oxide semiconductor (CMOS) image sensor and a method for fabricating the same.

With the development of image communication using the internet, demand of digital cameras is explosively increasing. Further, with an increase in distribution of mobile communication terminals with built-in cameras, such as personal digital assistants (PDA), International Mobile Telecommunications-2000 (IMT-2000), and code division multiple access (CDMA) terminals, demand of small camera modules is increasing.

In camera modules, charge coupled devices (CCD) and CMOS image sensors are widely used. A CCD has a complicated driving scheme and high power consumption. In addition, a CCD requires a large number of mask processes and the processes are complicated. Furthermore, a signal processor circuit cannot be implemented within a chip, so that it is difficult to realize on a chip. A CMOS image sensor includes a photodiode and a MOS transistor in a unit pixel and reproduces an image by detecting signals sequentially in a switching manner. Since the CMOS image sensor uses a CMOS fabrication technology, the CMOS image sensor has low power consumption and requires approximately 20 masks so that its process is much simpler than the CCD process which requires approximately 30 masks to approximately 40 masks. Since the CMOS image sensor can be realized on a chip with several signal processor circuits, it is considered as a next-generation image sensor.

Recently, higher density pixels are required to ensure competitiveness of CMOS image sensors. In order to implement high density pixels, the pixel size must be reduced. However, if the pixel size is reduced, the size of the photodiode is relatively reduced, and a fill factor, which is defined as an area occupied by the photodiode in a total pixel area, is reduced. If the size of the photodiode is reduced, a full well capacity, which is the number of signal charges one pixel can maintain, is also reduced and device characteristics are degraded. Thus, the area of the photodiode cannot be reduced without limitation.

Accordingly, as an effort to ensure the maximum well capacity within a finite area, there has been proposed a method that increases the area of the photodiode and decreases an interval of photodiodes, that is, an interval of adjacent pixels. However, the reduction in the interval of the photodiodes causes serious degradation in quantum efficiency (QE) and crosstalk characteristics of the image sensor, thereby leading to degradation in device characteristics.

As an effort to prevent the degradation of crosstalk characteristics, there been proposed a method that decreases the thickness of an epi-layer, and a method that separates the interval of the adjacent photodiodes by implanting impurity ions between the photodiodes. In the case of the former, the degradation of the quantum efficiency becomes more serious and, in the case of the latter, the width of the photodiode is relatively reduced, thereby causing the additional reduction of the maximum well capacity.

Conventionally, there have been proposed the above methods for reducing the inter-pixel crosstalk caused by diffusion of minority carriers, which are main factors of electrical crosstalk, but it can be seen that degradation of other main characteristics is caused.

Meanwhile, as the pixel size is reduced, it is required to additionally ensure the maximum well capacity. In order to increase the maximum well capacity in the finite photodiode region while maintaining a charge transfer characteristic, the photodiode is fabricated by performing an ion implantation process using low ion implantation energy. This is because the maximum potential depth within the photodiode is inversely proportional to the well capacity.

Therefore, in order to obtain a signal to noise ratio (SNR) and dynamic range meeting a level required in a small-sized photodiode, the ion implantation energy in the ion implantation process for fabricating the photodiode tends to be relatively lowered. However, these methods reduce the depletion region of the photodiode, causing the additional degradation in the quantum efficiency and crosstalk characteristic.

SUMMARY OF THE INVENTION

Embodiments of the present invention are directed to providing an image sensor, which is capable of improving quantum efficiency and electrical crosstalk characteristic by increasing a depletion region of a photodiode, and a method for fabricating the same.

In accordance with a first aspect of the present invention, there is provided an image sensor. The image sensor includes an epi-layer of a first conductivity type formed in a substrate, a photodiode formed in the epi-layer, and a first doping region of a second conductivity type formed under the photodiode to separate the first doping region from the photodiode.

In accordance with a second aspect of the present invention, there is provided a method for fabricating an image sensor. The method includes forming an isolation layer over a substrate having an epi-layer of a first conductivity type, forming a gate electrode over the substrate, forming a first doping region of a second conductivity type in the epi-layer exposed to one side of the gate electrode, and forming a photodiode over the first doping region to separate the photodiode from the first doping region.

In accordance with a third aspect of the present invention, there is provided a method for fabricating an image sensor. The method includes forming an isolation layer over a substrate having an epi-layer of a first conductivity type, forming a first doping region of a second conductivity type in the epi-layer, forming a gate electrode over the substrate, and forming a photodiode over the first doping region exposed to one side of the gate electrode to separate the photodiode from the first doping region.

DESCRIPTION OF SPECIFIC EMBODIMENTS

Figure 1:
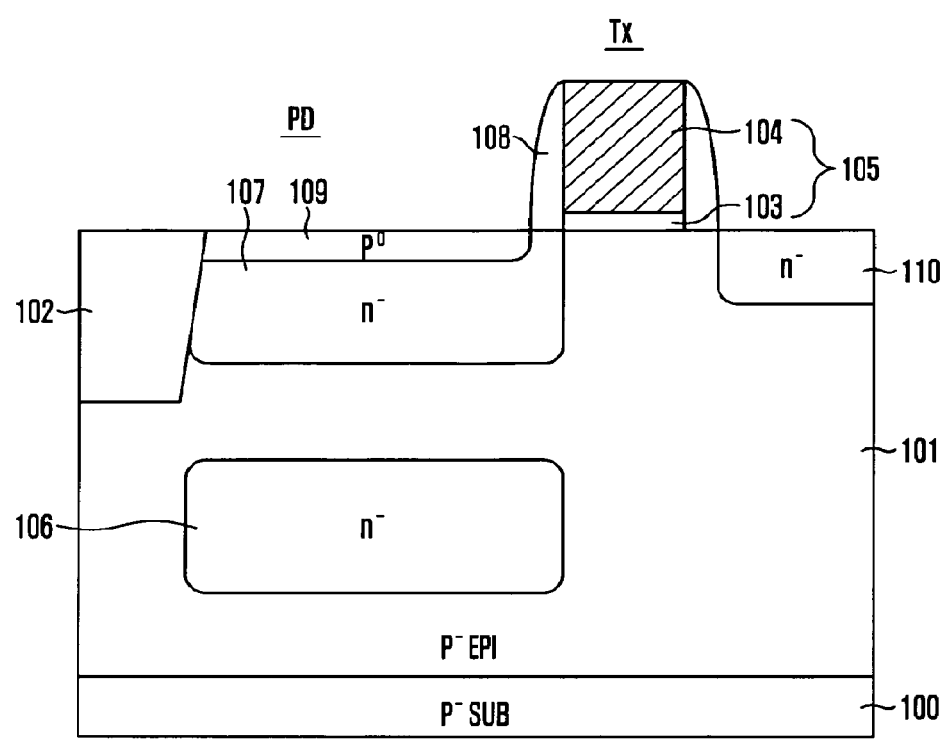
FIG. 1 illustrates a cross-sectional view of an image sensor in accordance with an embodiment of the present invention.

Hereinafter, an image sensor and a method for fabricating the same in accordance with the present invention will be described in detail with reference to the accompanying drawings. In the drawings, the thicknesses of layers and regions are exaggerated for clarity. It will also be understood that when a layer is referred to as being "on" another layer or substrate, it can be directly on the other layer or substrate, or intervening layers may also be present. Also, like reference numerals refer to like elements throughout the drawings. Furthermore, a first conductivity and a second conductivity described herein means different conductivity types, for example, a p-type and an n-type.

FIG. 1 illustrates a cross-sectional view of an image sensor in accordance with an embodiment of the present invention. For convenience, only a photodiode PD and a gate electrode of a transfer transistor $T_x$ in a unit pixel of a complementary metal-oxide semiconductor (CMOS) image sensor are illustrated.

Referring to FIG. 1, the image sensor in accordance with the embodiment of the present invention includes a first doping region 106 of a second conductivity type (for example, n-type), which is formed in an epi-layer 101 having a first conductivity type (for example, p-type) under a photodiode PD, so that the first doping region 106 is separated from the photodiode PD.

The first doping region 106 is formed not to be overlapped with the transfer transistor $T_X$ or to be separated far away from the transfer transistor $T_X$ so as not to influence charge transfer characteristics. In order to increase a depletion region of the photodiode PD upon operation of the transfer transistor $T_X$, the first doping region 106 is formed only under the photodiode PD in an island shape. The first doping region 106 is formed with the same conductivity type (for example, n-type) as the second doping region 107 of the photodiode PD at low doping concentration.

In the image sensor in accordance with the embodiment of the present invention, by forming the first doping region 106 having a lower concentration than the second doping region 107 under the photodiode, a wide depletion region can be ensured, while not affecting the optical characteristic of the image sensor. Thus, it is possible to improve both the quantum efficiency and electrical crosstalk characteristic of the small-sized image sensor.

Figure 2A:
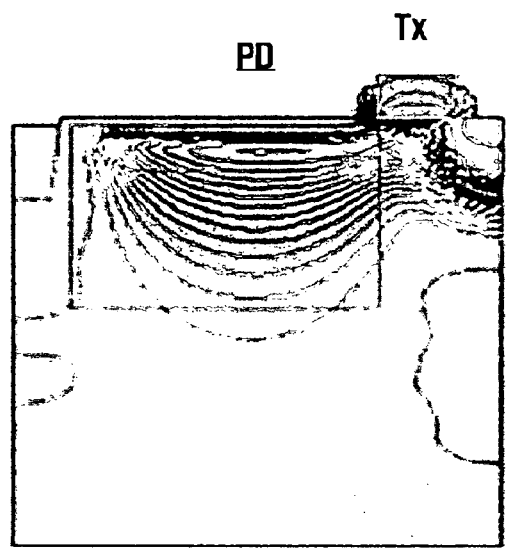
FIGS. 2A to 2B illustrate a distribution of a depletion region of a photodiode and an electrostatic potential after a transfer transistor is turned on, according to the related art and the present invention.
Figure 2B:
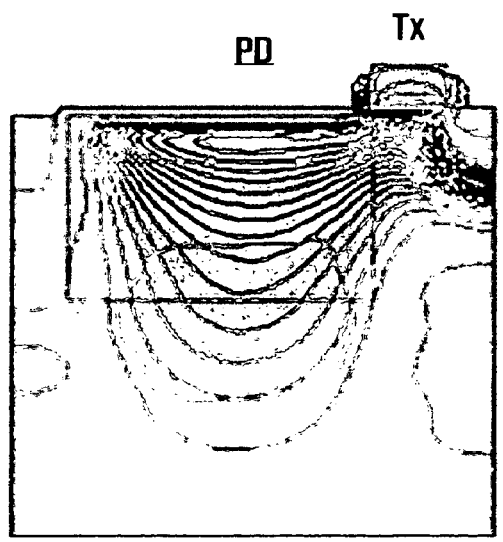

FIGS. 2A and 2B illustrate a distribution of the depletion region of the photodiode PD and an electrostatic potential after a transfer transistor is turned on, according to the related art and the present invention, respectively. Simulation conditions of FIGS. 2A and 2B are a low illumination state, and the low illumination transfer characteristics of the related art and the present invention are compared.

Referring to FIGS. 2A and 2B, the electrostatic potential distribution of the present invention is similar to that of the related art under the transfer transistor $T_X$. This means that the charge transfer characteristics in the related art and the present invention are similar to each other. That is, it can be construed that the first doping region 106 (see FIG. 1) of the present invention does not greatly affect the charge transfer characteristic. In addition, it can be seen that the electrostatic potential distribution of the present invention is expanded in a depth direction under the photodiode PD, compared with the electrostatic potential distribution of the related art. This means that the depletion region of the photodiode PD in accordance with the present invention is greatly increased compared with the related art. In accordance with the embodiment of the present invention, the first doping region 106 expands the depletion region of the photodiode PD in the depth direction, while not almost affecting the well capacity, thereby improving the quantum efficiency.

Figure 3A:
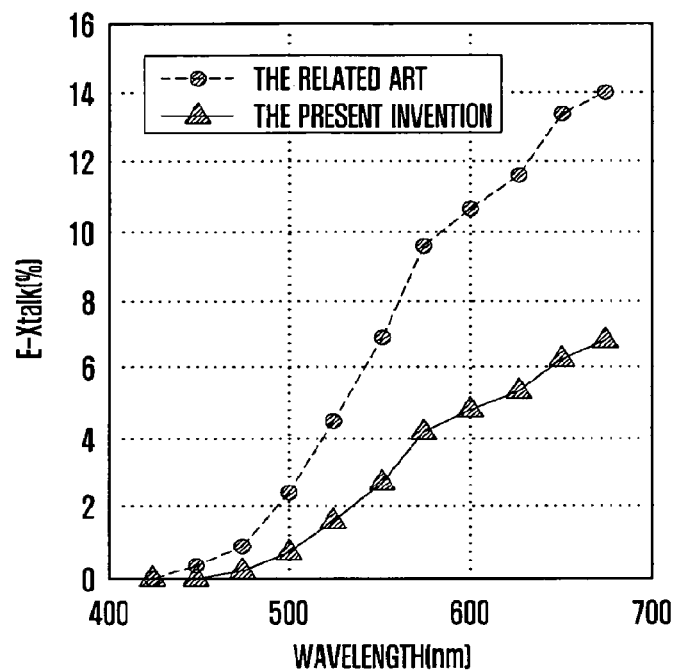
FIGS. 3A and 3B illustrate a simulation result for comparing the related art with the present invention in an electrical crosstalk and response characteristic.
Figure 3B:
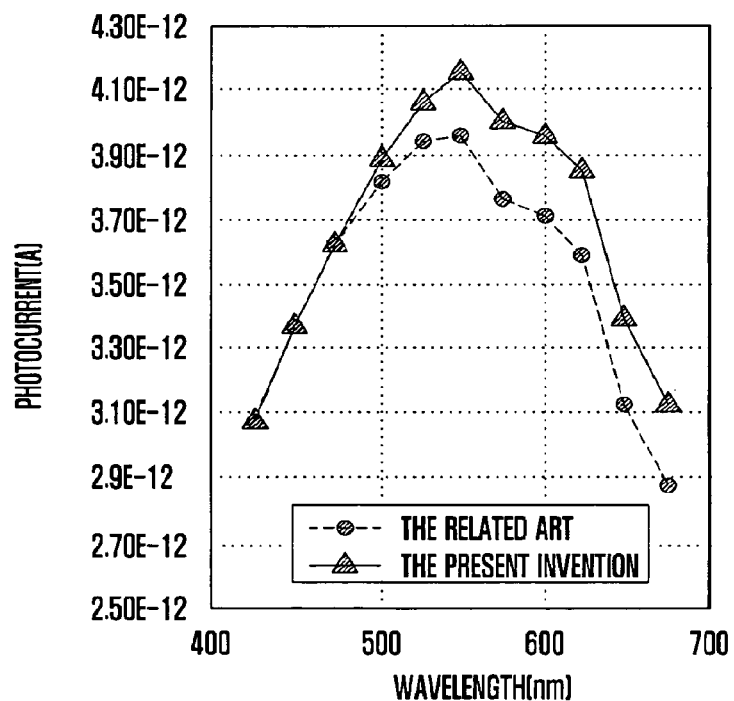

FIGS. 3A and 3B illustrate a simulation result for comparing the related art with the present invention in an electrical crosstalk and response characteristic. Specifically, FIG. 3A is a graph for comparing variation of an electrical crosstalk (Y-axis, E-Xtalk) with respect to a wavelength (X-axis) of incident light, and FIG. 3B is a graph for comparing variation of a photocurrent (Y-axis) with respect to a wavelength (X-axis) of incident light.

Referring to FIG. 3A, compared with the related art, the electrical crosstalk is remarkably improved in the same wavelength band of the incident light. As described above, the main factor of the electrical crosstalk is the thermal diffusion of minority carriers, and such an electrical crosstalk increases as the wavelength is longer. Most minority carriers are derived from electrons generated in a neutral region of the epi-layer which is dominant. Like in the present invention, the minority carriers expand the depletion region of the photodiode in the depth direction, and absorb electrons, which are generated in the neutral region, in the depletion region having 100% internal quantum efficiency, thereby minimizing the influence of crosstalk caused by the thermal diffusion of the minority carriers within the adjacent pixels.

Referring to FIG. 3B, compared with the related art, the photocurrent is remarkably increased in the same wavelength band of the incident light, especially the high wavelength band of approximately 500 nm or more. This means the increase of a charge collection efficiency representing how many electrons generated by photon exposure are maintained within the corresponding pixel. The increase of the charge collection efficiency improves the responsivity defined as amount of a signal transferred by the sensor per unit of an input optical energy.

A method for fabricating an image sensor in accordance with an embodiment of the present invention in FIG. 1 will be described below.

FIGS. 4A to 4D illustrate cross-sectional views of a method for fabricating an image sensor in accordance with an embodiment of the present invention.

Figure 4A:
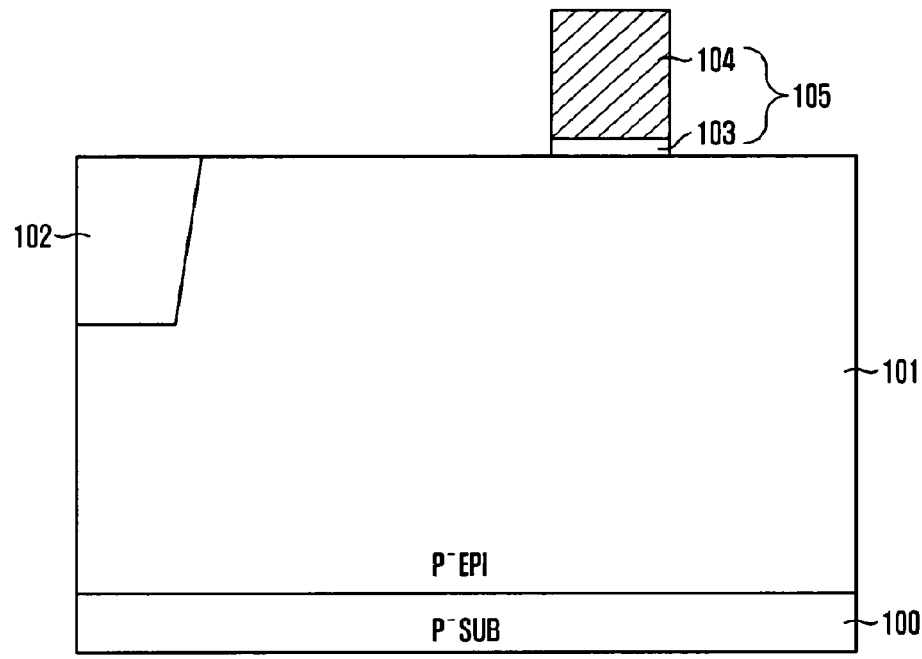
FIGS. 4A to 4D illustrate cross-sectional views of a method for fabricating an image sensor in accordance with an embodiment of the present invention.

Referring to FIG. 4A, an epi-layer 101 doped with a first conductivity type (for example, p-type) is formed on a substrate 100, for example, a silicon substrate heavily doped with the first conductivity type. In this case, the epi-layer 101 is doped with a lower concentration than the substrate 100.

An isolation layer 102 is locally formed in the substrate 100. The isolation layer 102 may be formed by a shallow trench isolation (STI) process or a local oxidation of silicon (LOCOS) process. In this case, as illustrated in FIG. 4A, the STI process is advantageous to high integration density. In the case where the STI process is applied, the isolation layer 102 may include a high density plasma (HDP) layer, which has an excellent a gap-fill characteristic even in a high aspect ratio, or a stacked structure of an HDP layer and a spin on dielectric (SOD) layer.

A gate insulation layer 103 and a gate conductive layer 104 are formed on the substrate 100 and are etched to form a gate electrode 105 of a transfer transistor.

Figure 4B:
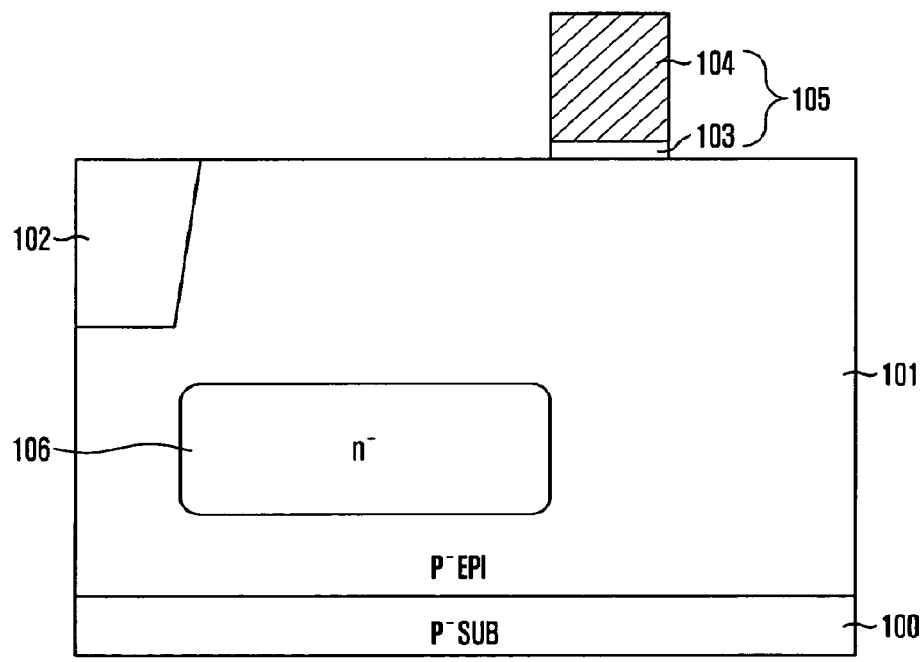

Referring to FIG. 4B, a first doping region 106 is formed in the epi-layer 101 by using an ion implantation mask (not shown) for forming the photodiode through a subsequent process. The first doping region 106 is formed under the photodiode in an island shape by performing an ion implantation process at a relatively high ion implantation energy so that the first doping region 106 can be separated from the photodiode. In addition, the first doping region 106 is formed with the same conductivity type (for example, n-type) as a second doping region (107, see FIG. 4C) of the photodiode at a low doping concentration. For example, the first doping region 106 is formed using phosphine ($PH_3$) at an ion implantation energy of at least 500 KeV or more, preferably approximately 500 KeV to approximately 1.5 MeV, with a dose of approximately $5 \times 10^{11}$ ions/$cm^2$, preferably approximately $1 \times 10^9$ ions/$cm^2$ to approximately $5 \times 10^{11}$ ions/$cm^2$.

Figure 4C:
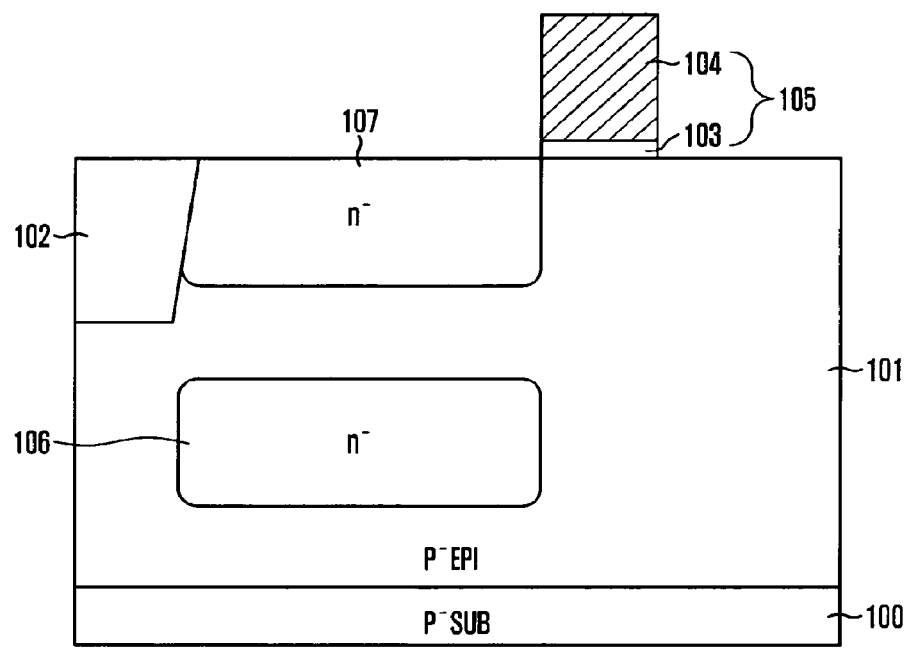

Referring to FIG. 4C, a second doping region 107 of the photodiode is formed using the ion implantation mask that is used in the process of forming the first doping region 106 in FIG. 4B. The second doping region 107 is formed with the same conductivity type as the first doping region 106 but at a high doping concentration. In addition, one side of the second doping region 107 is formed in alignment with the gate electrode 105 of the transfer transistor, and it is separated from the first doping region 106.

Figure 4D:
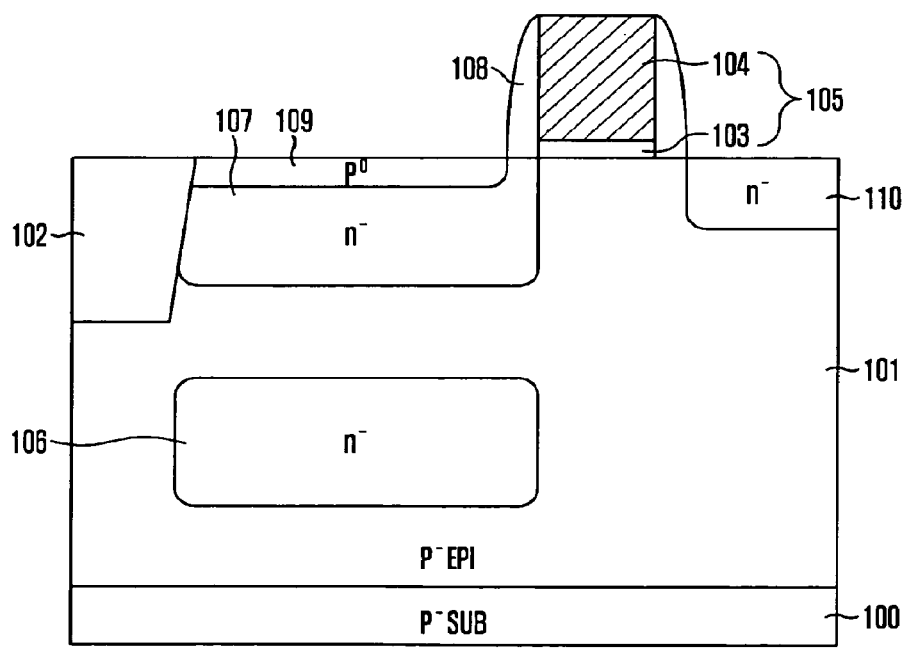

Referring to FIG. 4D, spacers 108 may be formed on both sidewalls of the gate electrode 105. In this case, the spacers 108 may include an oxide layer or a stacked structure of an oxide layer and a nitride layer. For example, the spacers 108 include a single-layered structure or stacked structure of a silicon oxide ($SiO_2$) layer, a silicon nitride ($Si_3N_4$) layer, and a silicon oxynitride (SiON).

A third doping region 109 may be formed on the second doping region 107. In this case, the third doping region 109 is formed in alignment with the spacers 108. Also, the third doping region 109 is formed with a conductivity type opposite to the second doping region 107, that is, the first conductivity type. The third doping region 109 constitutes a pinned photodiode together with the second doping region 107 to suppress a dark current.

Meanwhile, the third doping region 109 may be formed by performing an ion implantation process two times before the formation of the spacers 108. In this case, before the formation of the spacers 108, the primary ion implantation process is performed so that the third doping region 109 is aligned with one side of the gate electrode 105 and, after the formation of the spacers 108, the secondary ion implantation process is performed so that the third doping region 109 is aligned with one side of the spacers 108 at a higher concentration than the first ion implantation process.

A fourth doping region 110 is formed as a floating diffusion region within the epi-layer 101 exposed toward the other side of the gate electrode 105 of the transfer transistor, that is, the opposite side of the photodiode. The fourth doping region 110 is formed with the second conductivity type at a higher concentration than the second doping region 107. Since the sequent processes are identical to the general processes, their detailed description will be omitted.

The image sensor in accordance with the present invention can obtain the following effects.

First, by forming the doping region doped with a low concentration under the photodiode, a wide depletion region can be ensured, while not affecting the optical characteristic of the image sensor. Thus, it is possible to improve both the quantum efficiency and electrical crosstalk characteristic of the image sensor.

Second, by forming the doping region doped with a low concentration under the photodiode, without additional mask process, the increase of turn around time (TAT) and fabrication cost can be minimized.

While the present invention has been described in detail with respect to the specific embodiments, it should be noted that these embodiments are merely only for illustrative purposes and will not be construed as limiting the present invention. In particular, although it has been described above that the first doping region 106 is formed after the gate electrode 105 of the transfer transistor is formed, it may also be formed before the gate electrode 105 is formed. For example, the first doping region 106 may be formed after forming the isolation layer 102 before forming the gate insulation layer 103. Alternatively, the first doping region 106 may be formed before forming the isolation layer 102 after forming the epi-layer 101. Furthermore, the first doping region 106 may be formed by a blanket ion implantation process without any ion implantation mask. Moreover, it will be apparent to those skilled in the art that various changes and modifications may be made without departing from the spirit and scope of the invention as defined in the following claims.

The invention claimed is:

1. A method for fabricating an image sensor, the method comprising:
    forming a first doping region, wherein a top surface of the first doping region abuts an epitaxial layer; and
    forming a second doping region a location of the epitaxial layer for a photodiode;
    wherein the first doping region is located below and separated from the second doping region;
    wherein the epitaxial layer includes a first conductivity type;
    wherein the first doping region and the second doping region include a second conductivity type; and
    wherein a doping concentration of the first doping region is lower than a doping concentration of the second doping region.

2. The method of claim 1, wherein said forming a first doping region is performed before said forming a second doping region.

3. The method of claim 1, wherein:
    said forming a first doping region comprises using an ion implantation mask; and
    said forming a second doping region comprises using the same ion implantation mask.

4. The method of claim 1, wherein said forming a first doping region comprises implanting ions into the epitaxial layer.

5. The method of claim 4, wherein said implanting ions comprises implanting phosphine ions at an energy of at least 500 KeV.

6. The method of claim 4, wherein said implanting ions comprises implanting phosphine ions at an energy between approximately 500 KeV to approximately 1.5 MeV.

7. The method of claim 6, wherein said implanting ions comprises implanting phosphine ions at a dose of between approximately $1 \times 10^9$ ions/$cm^2$ to approximately $5 \times 10^{11}$ ions/$cm^2$.

8. A method for fabricating an image sensor, the method comprising:
    forming a first doping region, wherein a top surface of the first doping region abuts an epitaxial layer; and
    forming a photodiode in the epitaxial layer;
    wherein the first doping region is located below and separated from the photodiode;

wherein the epitaxial layer includes a first conductivity type;

wherein the first doping region includes a second conductivity type; and wherein the first doping region extends a depletion region of the photodiode.

9. The method of claim 8, wherein:

said forming a photodiode comprises forming a second doping region;

the second doping region includes the second conductivity type; and a doping concentration of the first doping region is lower than a doping concentration of the second doping region.

10. The method of claim 9, wherein:

said forming a first doping region comprises using an ion implantation mask; and said forming a second doping region comprises using the same ion implantation mask.

11. The method of claim 8, wherein said forming a first doping region comprises implanting ions into the epitaxial layer.

12. The method of claim 11, wherein said implanting ions comprises implanting phosphine ions at an energy of at least 500 KeV.

13. The method of claim 11, wherein said implanting ions comprises implanting phosphine ions at an energy between approximately 500 KeV to approximately 1.5 MeV.

14. The method of claim 13, wherein said implanting ions comprises implanting phosphine ions at a dose of between approximately $1\times10^9$ ions/cm$^2$ to approximately $5\times10^{11}$ ions/cm$^2$.

15. A method for fabricating an image sensor, the method comprising:

forming a first doping region, wherein a top surface of the first doping region abuts an epitaxial layer; and forming, in the epitaxial layer, a photodiode including a second doping region;

wherein the first doping region is located below and separated from the photodiode;

wherein the epitaxial layer includes a first conductivity type;

wherein the first doping region includes a second conductivity type; and wherein the first doping region extends a depletion region of the photodiode.

16. The method of claim 15, wherein said forming a first doping region is performed before said forming a photodiode.

17. The method of claim 15, wherein:

said forming a first doping region comprises using an ion implantation mask; and said forming a photodiode comprises using the same ion implantation mask to form the second doping region.

18. The method of claim 15, wherein said forming a first doping region comprises implanting phosphine ions into the epitaxial layer at an energy of at least 500 KeV.

19. The method of claim 15, wherein said forming a first doping region comprises implanting phosphine ions into the epitaxial layer at an energy between approximately 500 KeV to approximately 1.5 MeV.

20. The method of claim 19, wherein said implanting phosphine ions comprises implanting phosphine ions at a dose of between approximately $1\times10^9$ ions/cm$^2$ to approximately $5\times10^{11}$ ions/cm$^2$.

21. A method for fabricating an image sensor, the method comprising:

forming a first doping region within an epitaxial layer; and forming a photodiode above the first doping region, wherein the photodiode includes a second doping region and a third doping region above the second doping region;

wherein the first doping region is located below and separated from the second doping region;

wherein the epitaxial layer and the third doping region include a first conductivity type;

wherein the first doping region and the second doping region include a second conductivity type;

wherein a doping concentration of the third doping region is greater than a doping concentration of the second doping region; and wherein a doping concentration of the first doping region is lower than the doping concentration of the second doping region.

22. The method of claim 21, wherein said forming a first doping region is performed before said forming a second doping region.

23. The method of claim 21, wherein:

said forming a first doping region comprises using an ion implantation mask; and said forming a second doping region comprises using the same ion implantation mask.

24. The method of claim 21, wherein said forming a first doping region comprises implanting ions into the epitaxial layer.

* * * * *